(12) United States Patent
Li et al.

(10) Patent No.: US 10,679,965 B2
(45) Date of Patent: Jun. 9, 2020

(54) SEMICONDUCTOR PACKAGE STRUCTURE WITH PREFERRED HEAT DISSIPATING EFFICACY WITHOUT FORMATION OF SHORT CIRCUIT

(71) Applicant: ZOWIE Technology Corporation, New Taipei (TW)

(72) Inventors: Chia-Wei Li, New Taipei (TW); Yen-Ni Hu, New Taipei (TW)

(73) Assignee: ZOWIE TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/013,881

(22) Filed: Feb. 2, 2016

(65) Prior Publication Data

US 2016/0225684 A1 Aug. 4, 2016

(51) Int. Cl.
*H01L 23/00* (2006.01)
*H01L 21/56* (2006.01)
(Continued)

(52) U.S. Cl.
CPC ............ *H01L 24/96* (2013.01); *H01L 21/561* (2013.01); *H01L 21/78* (2013.01); *H01L 23/051* (2013.01);
(Continued)

(58) Field of Classification Search
CPC .............. H01L 23/49575; H01L 21/78; H01L 2224/32245; H01L 2224/33181;
(Continued)

(56) References Cited

U.S. PATENT DOCUMENTS 5,491,111 A * 2/1996 Tai .................... H01L 23/49562
257/E23.044
5,994,167 A * 11/1999 Tai .................... H01L 23/49805
257/E23.061
(Continued)

FOREIGN PATENT DOCUMENTS

| TW | 556970 U | 10/2003 |
| TW | M383816 U | 7/2010 |
| TW | I417994 B | 12/2013 |

*Primary Examiner* — Cuong Q Nguyen
*Assistant Examiner* — Shih Tsun A Chou
(74) *Attorney, Agent, or Firm* — Bacon & Thomas, PLLC

(57) ABSTRACT

A semiconductor package structure and manufacturing method thereof are provided, and the semiconductor package structure includes a semiconductor element, a top substrate, a bottom substrate, an insulating layer, and two metal conductive layers. The top substrate is mainly made of a conductive metal, and having a first separated portion on the top substrate, the first separated portion divides the top substrate into two blocks which are not electrically connected to each other. The bottom substrate is mainly made of the conductive metal, and having a second separated portion on the bottom substrate. The second separated portion divides the bottom substrate into two blocks which are not electrically connected to each other. The insulating layer is disposed between the top substrate and the bottom substrate. The metal conductive layer is disposed at two sides of the insulating layer and connected to the top substrate and the bottom substrate. The semiconductor element is contacted with the top substrate and the bottom substrate.

24 Claims, 9 Drawing Sheets

(51) Int. Cl.
*H01L 21/78* (2006.01)
*H01L 23/495* (2006.01)
*H01L 23/31* (2006.01)
*H01L 23/051* (2006.01)

(52) U.S. Cl.
CPC .... *H01L 23/3107* (2013.01); *H01L 23/49537* (2013.01); *H01L 24/97* (2013.01); *H01L 24/27* (2013.01); *H01L 24/29* (2013.01); *H01L 24/30* (2013.01); *H01L 24/32* (2013.01); *H01L 24/83* (2013.01); *H01L 2224/27848* (2013.01); *H01L 2224/293* (2013.01); *H01L 2224/29294* (2013.01); *H01L 2224/30181* (2013.01); *H01L 2224/32245* (2013.01); *H01L 2224/83447* (2013.01); *H01L 2224/97* (2013.01); *H01L 2924/1203* (2013.01); *H01L 2924/17747* (2013.01); *H01L 2924/1811* (2013.01)

(58) Field of Classification Search
CPC ... H01L 2924/1203; H01L 2924/17747; H01L 23/3107
See application file for complete search history.

(56) References Cited

U.S. PATENT DOCUMENTS

| | | | | |
|---|---|---|---|---|
| 6,582,991 B1* | 6/2003 | Maeda | H01L 24/81 | 257/778 |
| 6,590,291 B2* | 7/2003 | Akagawa | H01L 23/3121 | 257/686 |
| 6,703,707 B1* | 3/2004 | Mamitsu | H01L 23/051 | 257/713 |
| 7,176,058 B2* | 2/2007 | Yoon | H01L 21/78 | 257/E21.506 |
| 8,183,504 B2* | 5/2012 | Montoya | H01C 1/148 | 219/494 |
| 8,343,808 B2* | 1/2013 | Lin | H01L 21/56 | 257/E21.505 |
| 9,659,837 B2* | 5/2017 | Tolentino | H01L 23/3735 | |
| 2002/0162214 A1* | 11/2002 | Hetherton | H01C 1/1406 | 29/623 |
| 2006/0197200 A1* | 9/2006 | Kajiwara | H01L 21/561 | 257/673 |
| 2007/0241439 A1* | 10/2007 | Chung | G06K 19/07749 | 257/679 |
| 2009/0072384 A1* | 3/2009 | Wong | H01L 23/3677 | 257/712 |
| 2009/0115042 A1* | 5/2009 | Koyanagi | H01L 21/561 | 257/686 |
| 2009/0310322 A1* | 12/2009 | Koh | H01L 21/563 | 361/783 |
| 2010/0133666 A1* | 6/2010 | Meyer-Berg | H01L 21/568 | 257/666 |
| 2011/0031611 A1* | 2/2011 | Standing | H01L 21/4846 | 257/700 |
| 2011/0221054 A1* | 9/2011 | Lin | H01L 21/568 | 257/692 |
| 2012/0037413 A1* | 2/2012 | Kaneda | H05K 3/0038 | 174/260 |
| 2013/0146991 A1* | 6/2013 | Otremba | H01L 25/071 | 257/401 |
| 2013/0214427 A1* | 8/2013 | Nakanoya | H01L 23/5384 | 257/774 |
| 2013/0256856 A1* | 10/2013 | Mahler | H01L 21/76816 | 257/676 |
| 2013/0334682 A1* | 12/2013 | Kim | H01L 23/295 | 257/737 |
| 2014/0319549 A1 | 10/2014 | Tsai et al. | | |
| 2015/0115458 A1* | 4/2015 | Palm | H01L 24/31 | 257/774 |
| 2015/0155256 A1* | 6/2015 | Lin | H01L 24/81 | 257/737 |
| 2015/0223320 A1* | 8/2015 | Gerhauer | H01L 23/49833 | 361/762 |
| 2015/0228616 A1* | 8/2015 | Palm | H01L 21/78 | 257/676 |
| 2015/0380374 A1* | 12/2015 | Nakamura | H05K 1/181 | 361/783 |
| 2016/0133558 A1* | 5/2016 | Stahr | H01L 23/36 | 257/692 |

\* cited by examiner

SEMICONDUCTOR PACKAGE STRUCTURE WITH PREFERRED HEAT DISSIPATING EFFICACY WITHOUT FORMATION OF SHORT CIRCUIT

BACKGROUND OF THE INVENTION

Field of Invention

The present invention relates to a package structure, especially relates to a semiconductor package structure with preferred heat dissipating efficacy and manufacturing method thereof.

Description of Related Art

As technology has advanced, various electronic devices are used in life widely. These electronic devices are, for example, mobile phones, PCs, tablets which can bring great convenience for people. Wherein, these electronic devices are all configured with some semiconductor elements, and the temperature of the semiconductor elements will rise after long time operation. The semiconductor elements may be damaged without heat dissipation effectively.

In Taiwan Patent 1417994, a semiconductor package structure is provided. Referring to FIG. 6, the semiconductor package structure 1 includes a top substrate 71, a top-outside conductive terminal 71A, a top-inside conductive trace 71B, a bottom substrate 72, a bottom-outside conductive terminal 72A, a bottom-inside conductive trace 72B, an insulating layer 80, and a chip 90. In use, the heat generated from the chip 30 is mainly transferred to outside by the top substrate 71 and the bottom substrate 72, and some heat is conducted to outside by the top-outside conductive terminal 71A, the top-inside conductive trace 71B, the bottom-outside conductive terminal 72A, and the bottom-inside conductive trace 72B for achieving the heat dissipating efficacy.

However, as technology has advanced, the operating rate of the chip 90 is more highly, and then the heat generated from the chip is more. Thus, the above heat conduction will not meet the requirement of heat dissipation. In addition, the top substrate 71 is disposed between the top-inside conductive trace 71B and the top-outside conductive terminal 71A and the bottom substrate 72 is disposed between the bottom-inside conductive trace 72B and the top-outside conductive terminal 71A and the top substrate 71 and the bottom substrate 72 are mode of glass fiber. Thus, the heat conducting coefficient of the glass fiber is lower, so that the heat generated from the chip 90 is not exhausted easily. Thus, the heat will accumulated in the semiconductor element and cause the temperature of the chip 90 rise increasingly, which reduce the life of the chip 90.

Therefore, there is a need for persons skilled in the art to investigate a means to design a semiconductor package structure with a preferred heat dissipating efficacy.

SUMMARY OF THE INVENTION

To solve the problems described above, one aspect of the invention is to provide a semiconductor package structure, wherein the semiconductor package structure has a preferred heat dissipating efficacy without the formation of a short circuit.

To achieve the foregoing and other aspects, a semiconductor package structure is provided. The semiconductor package structure includes a semiconductor element, a top substrate, a bottom substrate, an insulating layer, and two metal conductive layers. The top substrate is mainly made of a conductive metal, and a first separated portion is configured to the top substrate. The first separated portion divides the top substrate into two blocks which are not electrically connected to each other. The bottom substrate is mainly made of a conductive metal. A second separated portion is configured to the bottom substrate, and the second separated portion divides the bottom substrate into two blocks which are not electrically connected to each other. The insulating layer is disposed between the top substrate and the bottom substrate. The metal conductive layer is disposed at two sides of the insulating layer, and connected to the top substrate and the bottom substrate. Wherein, the semiconductor element is contacted with the top substrate and the bottom substrate.

In the semiconductor package structure, the top substrate and the bottom substrate are mainly made of copper.

In the semiconductor package structure, a bottom surface of the top substrate is configured with at least a first conductive pad, a upper surface of the bottom substrate is configured with at least a second conductive pad, and the semiconductor element is disposed between the first conductive pad and the second conductive pad.

The semiconductor package structure further comprises a solder paste, the solder paste is coated on the first conductive pad and the second conductive pad.

In the semiconductor package structure, at least one through hole is configured to two sides of the metal conductive layer respectively, the metal conductive layer is formed on a inner surface of the through hole.

In the semiconductor package structure, the semiconductor element is diodes.

To achieve the foregoing and other aspects, a manufacturing method of the semiconductor package structure is provided, which comprises following steps:
(a) providing a top metal substrate and a bottom metal substrate;
(b) disposing the semiconductor element on the bottom metal substrate;
(c) stacking the top metal substrate and the bottom metal substrate for disposing the semiconductor element between the top metal substrate and the bottom metal substrate;
(d) performing an adhesive filling operation to form an insulating layer between the top metal substrate and the bottom metal substrate;
(e) performing a drilling process for the top metal substrate and the bottom metal substrate to form multiple through holes;
(f) forming a metal conductive layer on a inner surface of the through hole, the metal conductive layer is connected to the top metal substrate and the bottom metal substrate;
(g) forming multiple first separated and multiple second separated portions on the top metal substrate and the bottom metal substrate respectively, the first separated portions and the second separated portions divide the top metal substrate and the bottom metal substrate into multiple blocks respectively, wherein each block is configured with the through hole;
(h) performing a singulation process to form multiple semiconductor package structures.

In the manufacturing method of the semiconductor package structure, in step (a), a bottom surface of the top metal substrate is configured with at least a first conductive pad, and a upper surface of the bottom metal substrate is configured with at least a second conductive pad.

In the manufacturing method of the semiconductor package structure, a solder paste is provided to coat on the first conductive pad and the second conductive pad between in step (a) and step (b).

In the manufacturing method of the semiconductor package structure, the adhesive is filled into the gap formed between the top metal substrate and the bottom metal substrate by capillary in the adhesive filling operation of step (d).

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Other features and advantages of the invention will be further understood from the further technological features disclosed by the embodiments of the invention wherein there are shown and described embodiments of this invention, simply by way of illustration of best modes to carry out the invention.

Figure 1:
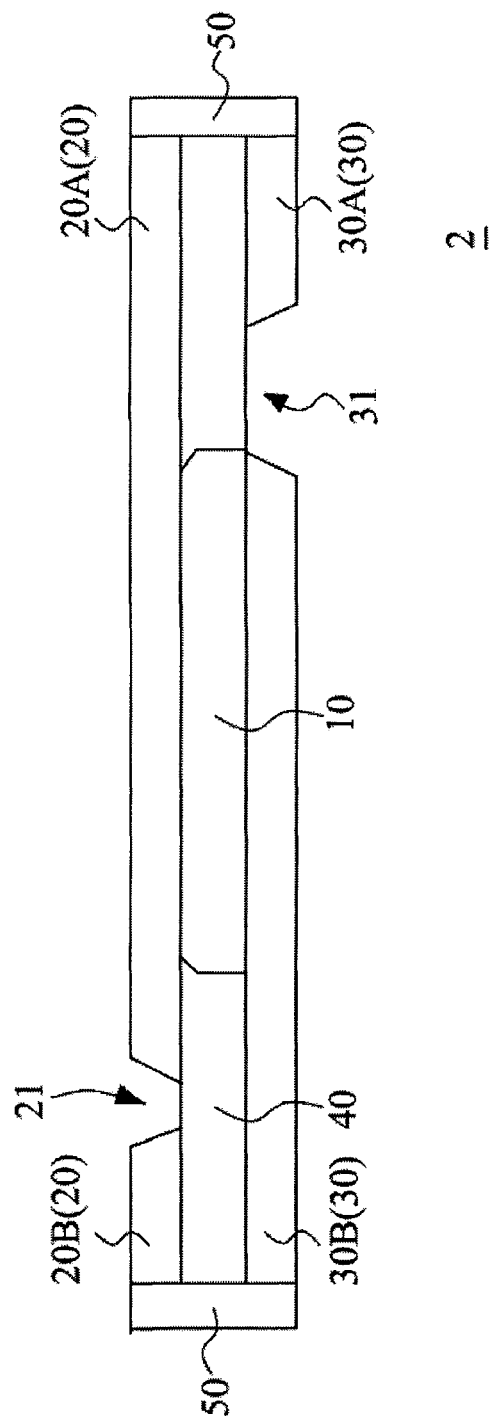
FIG. 1 is a cross-sectional view of semiconductor package structure according to one embodiment of the present invention.

Referring to FIG. 1, FIG. 1 is a cross-sectional view of semiconductor package structure according to one embodiment of the present invention. The semiconductor package structure 2 comprises a semiconductor element 10, a top substrate 20, a bottom substrate 30, a insulating layer 40, and two metal conductive layers 50. In the present embodiment, the semiconductor element 10 is diodes. The top substrate 20 is mainly made of conductive metal (for example, copper), and a first separated portion 21 is configured to the top substrate 20, wherein the first separated portion 21 divides the top substrate 20 into two blocks which are not electrically connected to each other. In addition, the bottom substrate 30 is mainly made of conductive metal (for example: copper), and a second separated portion 31 is configured to the bottom substrate 30, wherein the second separated portion 31 divides the bottom substrate 30 into two blocks which are not electrically connected to each other. In addition, the insulating layer 40 is disposed between the top substrate 20 and bottom substrate 30, and surround the semiconductor element 10. Wherein, the semiconductor element 10 is contacted with the top substrate 20 and the bottom substrate 30. In addition, the metal conductive layer 50 is formed on two sides of the semiconductor package structure 2, and connected to the top substrate 20 and the bottom substrate 30.

Referring to FIG. 1 continuously, the first separated portion 21 divides the top substrate 20 of the semiconductor package structure 2 into two blocks which are not electrically connected to each other. The two blocks are the first top block 20A and the second top block 20B respectively. The first top block 20A is located in right side of the first separated portion 21 configured on the top substrate 20, and the second top block 20B is located in left side of the first separated portion 21 configured on the top substrate 20. Similarly, the second separated portion 31 of the bottom substrate 30 divides the bottom substrate 30 into two blocks which are not electrically connected to each other. The two blocks are the first bottom block 30A and the second bottom block 30B respectively. The first bottom block 30A is located in right side of the second separated portion 31 configured on the bottom substrate 30, and the second bottom block 30B is located in left side of the second separated portion 31 configured on the bottom substrate 30. Wherein, the first top block 20A, the first bottom block 30A, and the metal conductive layer 50 are electrically connected with each other to constitute a positive terminal of the semiconductor package structure 2 which electrically connected to a positive terminal of the semiconductor element 10. Relatively, the second top block 20B, the second bottom block 30B, and the metal conductive layer 50 are electrically connected to constitute a negative terminal of the semiconductor package structure 2 which electrically connected to a negative terminal of the semiconductor element 10. From above, the configurations of the first separated portion 21 and the second separated portion 31 can cause the positive terminal and the negative terminal of the semiconductor package structure 2 without electrically connection, and then be without the formation of a short circuit. Besides, the semiconductor package structure 2 can be configured on a circuit board by wiring or SMT (Surface Mount Technology). In addition, the insulating layer 40 can isolated external water vapor and suspended particulates. This prevents the semiconductor element 10 from pollution of external water vapor and suspended particulates, and ensures the quality of the semiconductor element 10.

Figure 2:
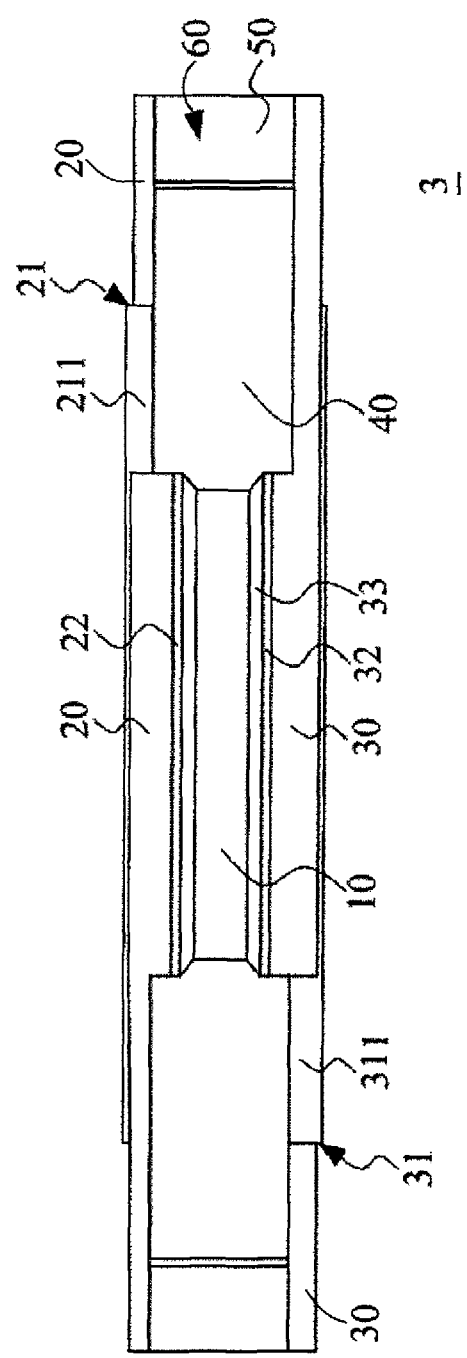
FIG. 2 is a structural view of semiconductor package structure according to one embodiment of the present invention.
Figure 3:
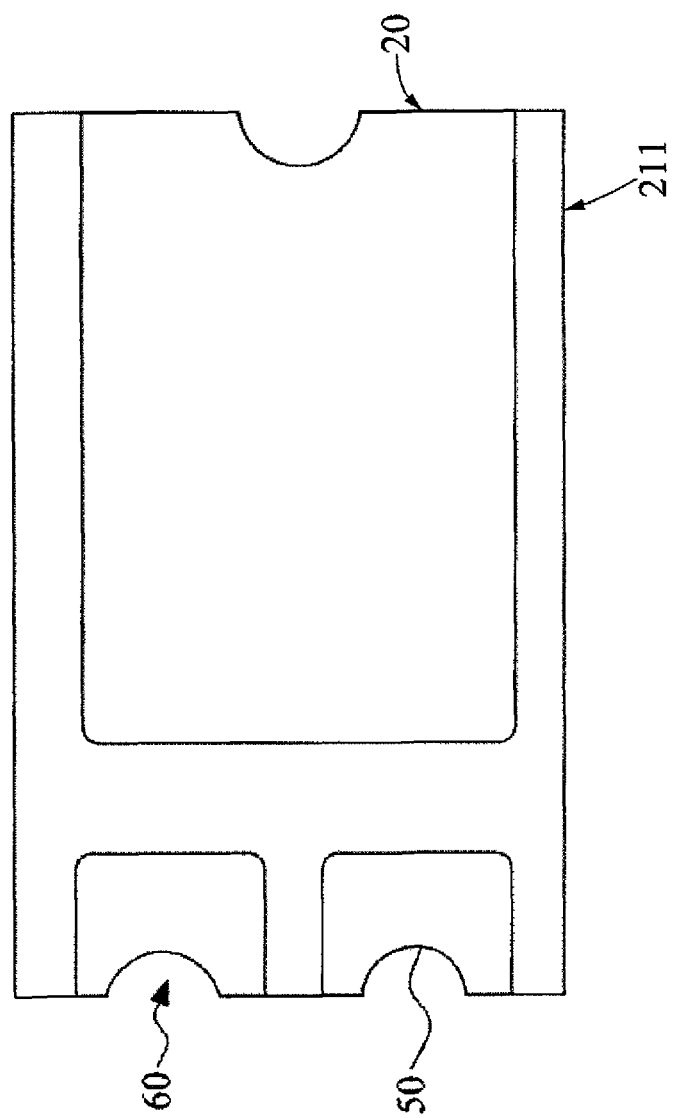
FIG. 3 is a top view of semiconductor package structure according to one embodiment of the present invention.

FIG. 2 is a structural view of semiconductor package structure according to one embodiment of the present invention, and FIG. 3 is a top view of semiconductor package structure according to one embodiment of the present invention. Referring to FIG. 2 and FIG. 3, in the present embodiment, the structural components common to those shown in FIG. 1 are denoted by like reference numerals, and a detailed description thereof is omitted. In the semiconductor package structure 3, the bottom surface of the top substrate 20 is configured with a first conductive pad 22, In addition, the upper surface of the bottom substrate 30 is configured with a second conductive pad 32. Wherein, the semiconductor element 10 is disposed between the first conductive pad 22 and the second conductive pad 32. In addition, a solder paste 33 is coated on the first conductive pad 22 and the second conductive pad 32. There is a electrical connection formed between the solder paste 33 and the semiconductor element 10. In the present embodiment, the solder paste 33 can be replaced of a conductive paste. When the conductive paste is coated on first conductive pad 22 and the second conductive pad 32, the conductive paste can be performed with a drying process to solidify the conductive paste for having a joining effect, and then the semiconductor element 10 can be fixed between the first conductive pad 22 and the second conductive pad 32. In addition, at least one through hole 60 are configured to two sides of the semiconductor package structure 3 respectively (in the present embodiment, left side of the semiconductor package structure 3 is configured with a through hole 60, and right sides of the semiconductor package structure 3 is configured with two through holes 60), and the metal conductive layer 50 is formed on inner surface of through hole 60. In addition, a first solder mask 211 is configured on the first separated portion 21. Similarly, a second solder mask 311 is configured on the second separated portion 31.

FIG. 4A-FIG. 4G is cross-sectional views of manufacturing a semiconductor package structure 3 of the present invention. FIG. 5 is a flowchart of manufacturing a semiconductor package structure 3 of the present invention. Referring to FIG. 4A-FIG. 4G and FIG. 5. Firstly, in step S1, as shown FIG. 4A, providing a top metal substrate 26 and a bottom metal substrate 36. Wherein, a bottom surface of the top metal substrate 26 is configured with at least a first conductive pad 22, and a upper surface of the bottom metal substrate 36 is configured with at least a second conductive pad 32. Then, in step S2, as shown FIG. 4B, a solder paste 33 is coated on the first conductive pad 22 of the bottom surface of top metal substrate 26 and the second conductive pad 32 of the upper surface of the bottom metal substrate 36. Next, in step S3, as shown FIG. 4C, disposing the semiconductor element 10 between the bottom metal substrate 36 and the top metal substrate 26. More detail, the semiconductor element 10 is disposed between first conductive pad 22 and the second conductive pad 32, and the bottom metal substrate 36, the top metal substrate 26, and semiconductor element 10 coated with the solder paste 33 are placed into a soldering furnace. The solder paste 33 will produce a join effect by the influences of high temperature, and then the semiconductor element 10 can contact with the bottom metal substrate 36 and the top metal substrate 26. Next, in step S4, as shown FIG. 4D, a gap is formed between two sides of the top metal substrate 26 and the bottom metal substrate 36. When the top metal substrate 26 and the bottom metal substrate 36 are stacked, an adhesive filling operation can be performed through the gap to form a insulating layer 40 by capillary. The package structure formed with are insulating layer 40 can be baked by the oven, and the insulating layer 40 formed by the adhesive filling operation will be solidified by the influences of high temperature.

Figure 4A:
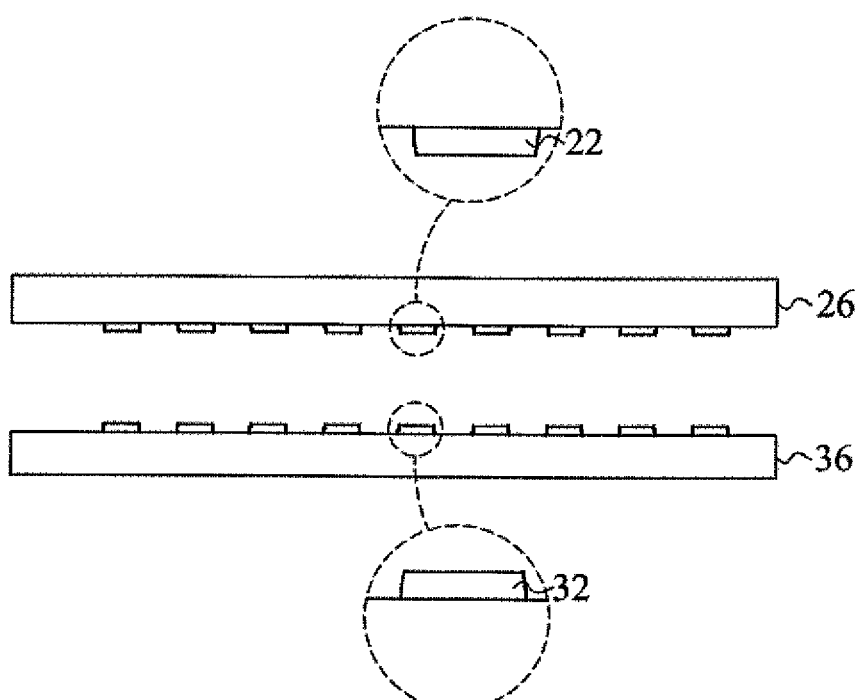
FIG. 4A-FIG. 4G is cross-sectional views of manufacturing a semiconductor package structure 3 of the present invention.
Figure 4B:
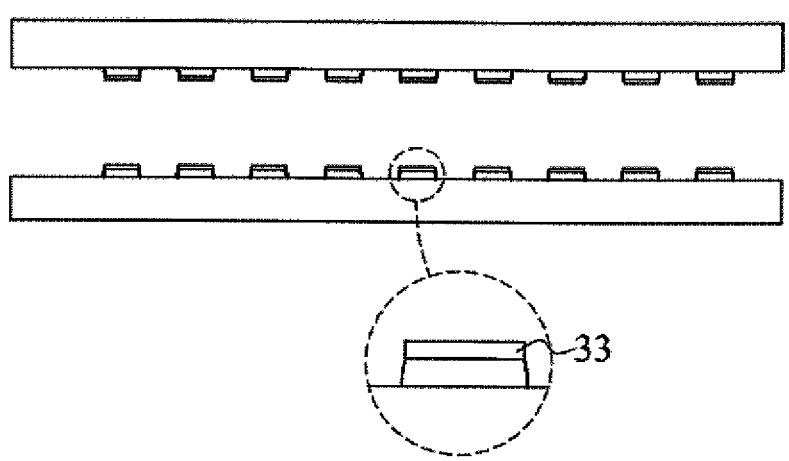
Figure 4C:
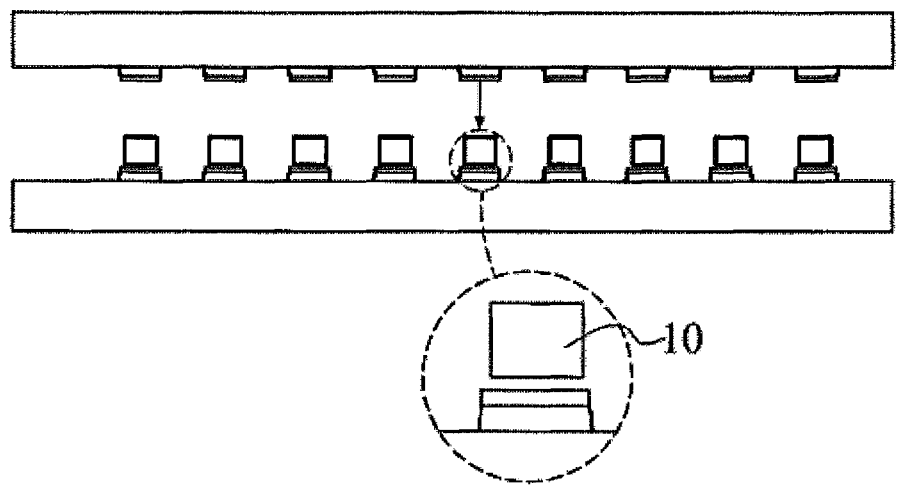
Figure 4D:
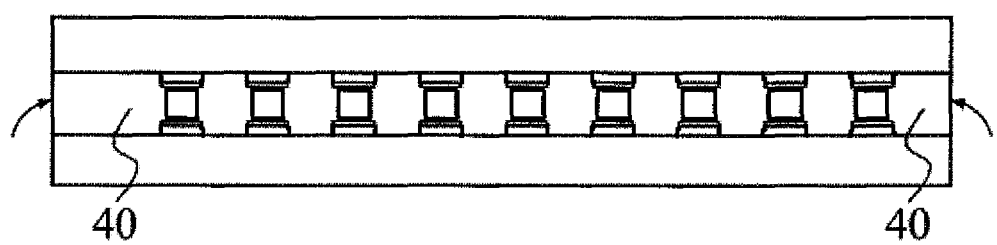
Figure 4E:
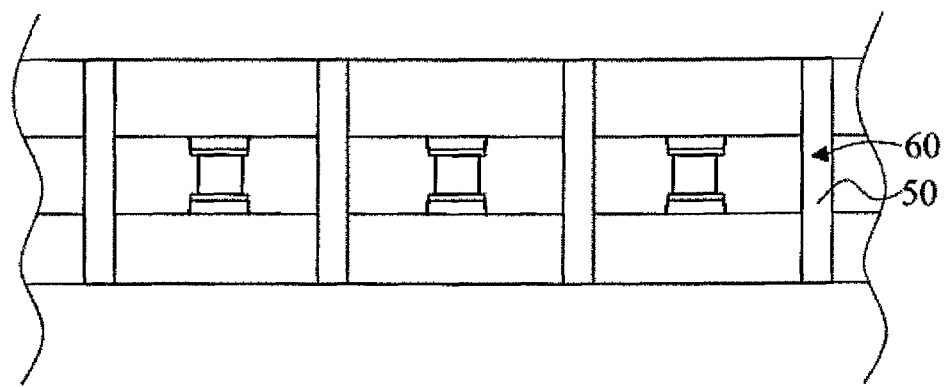
Figure 4F:
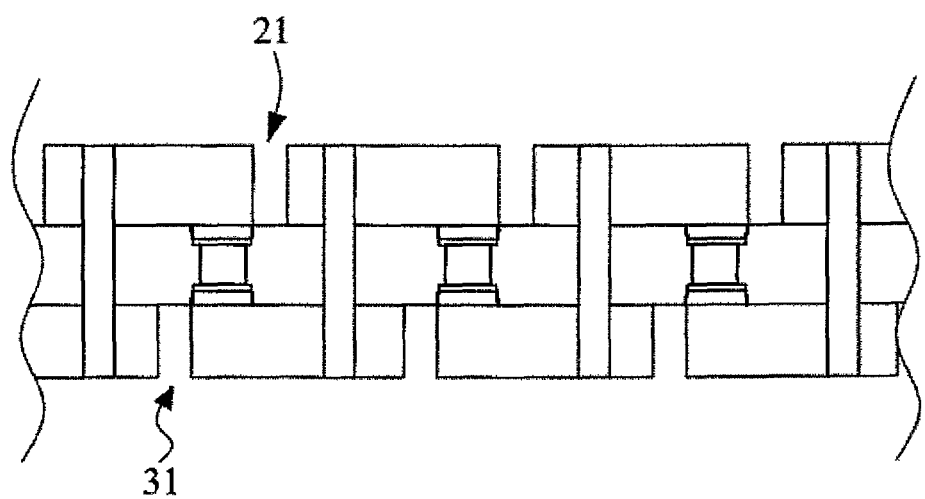
Figure 4G:
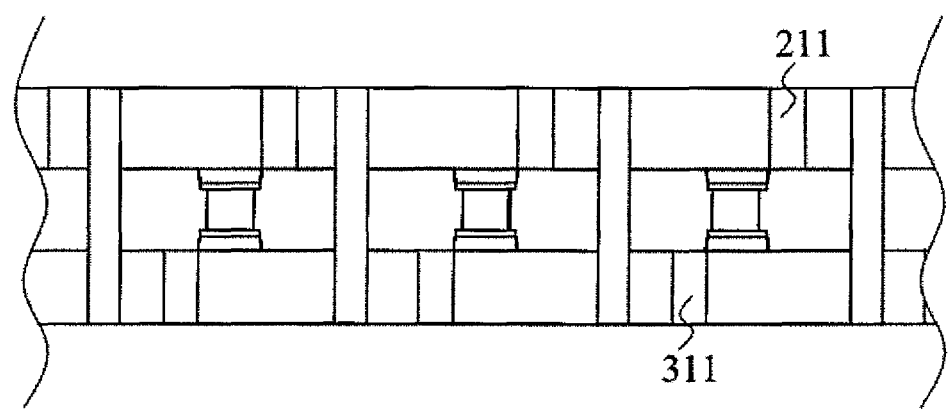
Figure 5:
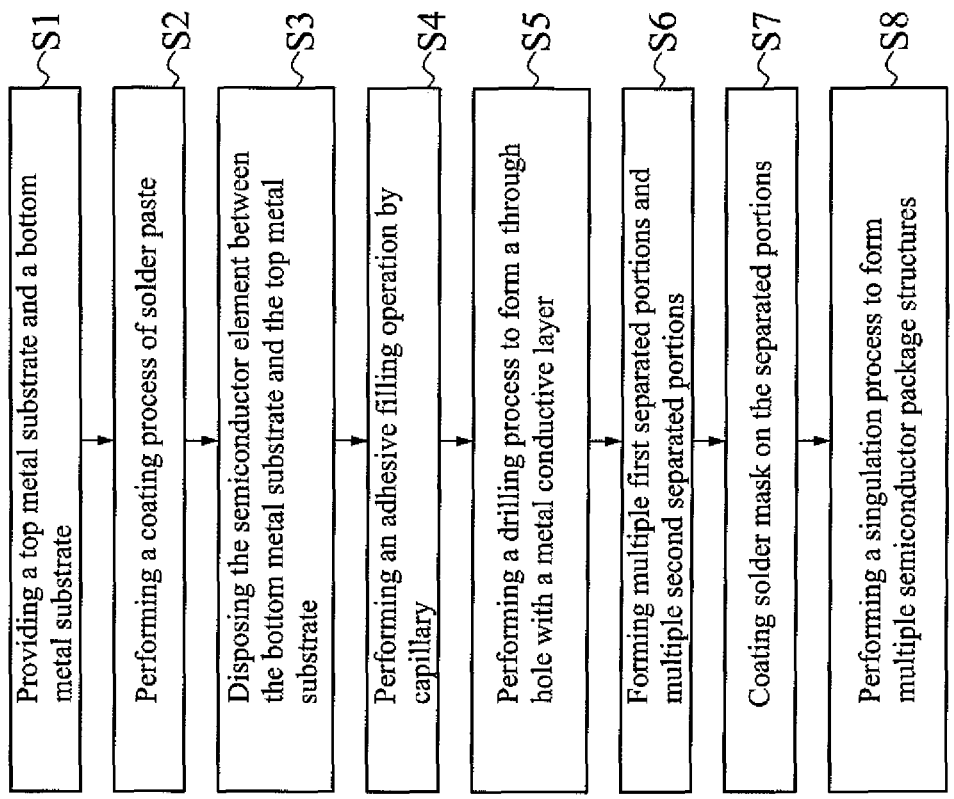
FIG. 5 is a flowchart of manufacturing a semiconductor package structure 3 of the present invention.
Figure 6:
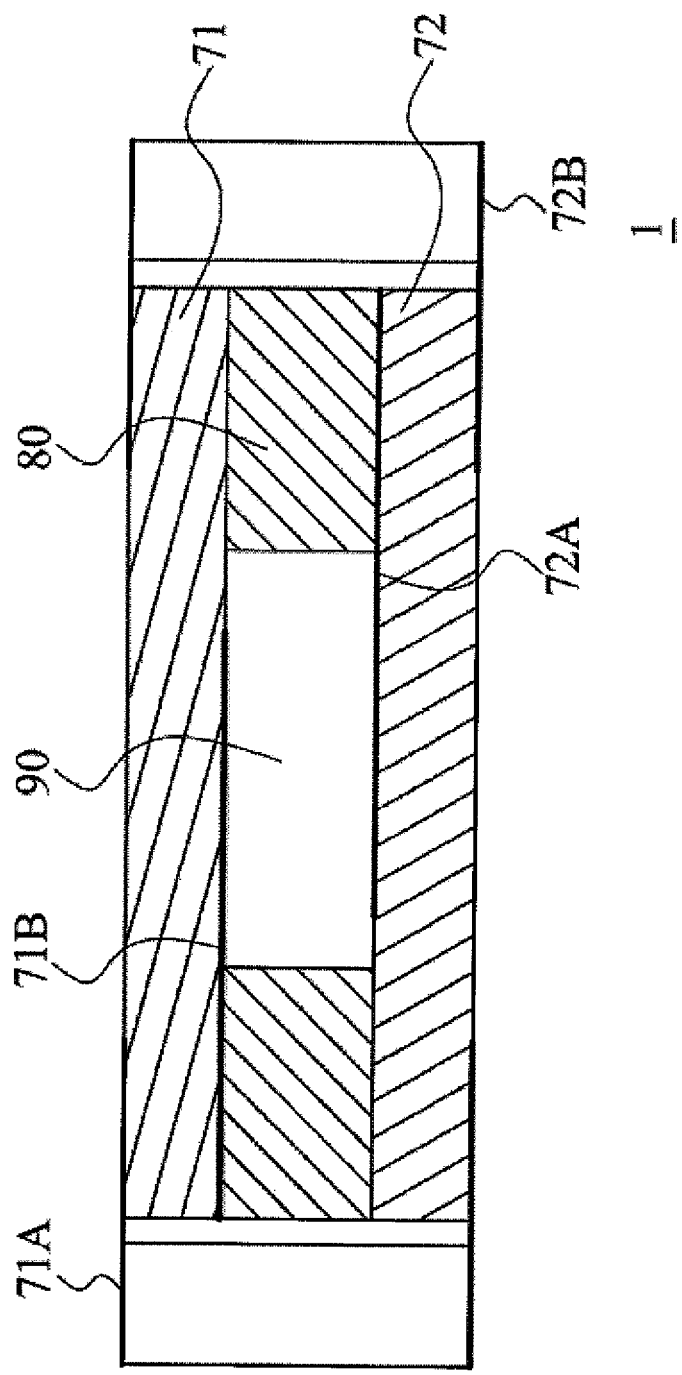
FIG. 6 is a structural view of semiconductor package structure in prior art.

Next, in step S5, as shown FIG. 4E, performing a drilling process for the top metal substrate 26 and the bottom metal substrate 36, and multiple through holes 60 are formed in two sides of each semiconductor element 10, and a metal conductive layer 50 can be formed in through hole 60 by plating process. Next, in step S6, as shown FIG. 4F, the top metal substrate 26 and the bottom metal substrate 36 can be performed with a chemical etching respectively to form multiple first separated portions 21 and multiple second separated portions 31 on the top metal substrate 26 and the bottom metal substrate 36. Next, in step S7, as shown FIG. 4G, coating a first solder mask 211 on the first separated portion 21 of the semiconductor package structure 3, and coating a second solder mask 311 on the second separated portion 31. Thereafter, in step S8, performing a singulation process to form multiple semiconductor package structures 3 (as shown FIG. 2).

To sum up, compared to the semiconductor package structure 1 in prior art, the top substrate 20 and bottom substrate 30 of the semiconductor package structure 2 or semiconductor package structure 3 in the present embodiment are made of conductive metal. Therefore, the heat generated from the semiconductor element 10 in use can conduct and diffuse to outside by the heat conduction of the metal substrate, and the semiconductor element 10 may not be damaged by the influences of high temperature.

Although the description above contains many specifics, these are merely provided to illustrate the invention and should not be construed as limitations of the invention's scope. Thus it will be apparent to those skilled, in the art that various modifications and variations can be made in the system and processes of the present invention without departing from the spirit or scope of the invention.

What is claimed is:

1. A method for manufacturing a semiconductor package structure, comprising following steps:
   (a) providing a top metal substrate and a bottom metal substrate;
   (b) disposing a semiconductor element on the bottom metal substrate;
   (c) stacking the top metal substrate and the bottom metal substrate to dispose the semiconductor element between the top metal substrate and the bottom metal substrate;
   (d) after stacking the top metal substrate and the bottom metal substrate, performing an adhesive filling operation to form an insulating layer between the top metal substrate and the bottom metal substrate;
   (e) after performing the adhesive filling operation, performing a drilling process for the top metal substrate and the bottom metal substrate to form multiple through holes;
   (f) forming a metal conductive layer on an inner surface of each of the multiple through holes, the metal conductive layer being connected to the top metal substrate and the bottom metal substrate;
   (g) forming a first separated portion and a multiple second separated portion on the top metal substrate and the bottom metal substrate respectively, the first separated portion and the second separated portion dividing the top metal substrate and the bottom metal substrate into two top blocks and two bottom blocks respectively, wherein each of the top and bottom blocks is configured with at least one of the multiple through holes;
   (h) performing a singulation process to form singular semiconductor package structures each having two top blocks and two bottom blocks, wherein the semiconductor package structures each include one first metal conductive layer on one side of the semiconductor package structure and one second metal conductive layer on an opposite side of the semiconductor package structure, such that the first metal conductive layer connects a first of the two top blocks with a second of the two bottom blocks, and the second metal conductive layer connects the first of the two bottom blocks with the second of the two top blocks.

2. The method of claim 1, wherein in step (a), a bottom surface of the top metal substrate is configured with at least a first conductive pad, and an upper surface of the bottom metal substrate is configured with at least a second conductive pad.

3. The method of claim 2, wherein a solder paste is provided to coat on the first conductive pad and the second conductive pad in step (a) and step (b).

4. The method of claim 2, wherein the adhesive is filled into a gap formed between the top metal substrate and the bottom metal substrate by capillary in the adhesive filling operation of step (d).

5. The method of claim 1, further comprising, following the step of (g), a step of coating a first solder mask on the first separated portion and coating a second solder mask on the second separated portion.

6. A method for manufacturing a semiconductor package structure, comprising following steps:
(a) providing a top metal substrate and a bottom metal substrate;
(b) disposing multiple semiconductor elements on the bottom metal substrate at predetermined positions;
(c) stacking the top metal substrate and the bottom metal substrate to dispose the multiple semiconductor elements between and in contact with the top metal substrate and the bottom metal substrate;
(d) after stacking the top metal substrate and the bottom metal substrate, performing an adhesive filling operation to form an insulating layer between the top metal substrate and the bottom metal substrate;
(e) after performing the adhesive filling operation, performing a drilling process for the top metal substrate and the bottom metal substrate to form multiple through holes, with each through hole being adjacent to one of the multiple semiconductor elements;
(f) forming a metal conductive layer on an inner surface of each of the multiple through holes, the metal conductive layer being connected to the top metal substrate and the bottom metal substrate; and
(g) forming a first separated portion and a second separated portion on the top metal substrate and the bottom metal substrate respectively, the first separated portion and the second separated portion dividing a region of the top metal substrate and a region of the bottom metal substrate, both corresponding to one of the semiconductor elements, into two top blocks and two bottom blocks respectively, wherein each of the top and bottom blocks is configured with at least one of the multiple through holes;
wherein the semiconductor package structure comprises multiple semiconductor packages, and
wherein each of the multiple semiconductor packages comprises two top blocks and two bottom blocks, first metal conductive layer on one side of the semiconductor package, and one second metal conductive layer on an opposite side of the semiconductor package, such that the first of the two metal conductive layer connects a first of the two top blocks with a second of the two bottom blocks, and the second metal conductive layer connects the first of the two bottom blocks with the second of the two top blocks.

7. The method of claim 6, further comprising, following the step of (g), a step of coating a first solder mask on the first separated portion and coating a second solder mask on the second separated portion.

8. The method of claim 7, further comprising, following the step of coating, a step (h) of performing a singulation process to form the multiple semiconductor packages.

9. The method of claim 6, further comprising, following the step of (g), a step (h) of performing a singulation process to form the multiple semiconductor packages.

10. The method of claim 9, wherein in step (a), a bottom surface of the top metal substrate is configured with at least a first conductive pad, and an upper surface of the bottom metal substrate is configured with at least a second conductive pad.

11. The method of claim 10, wherein a solder paste is provided to coat on the first conductive pad and the second conductive pad between in step (a) and step (b).

12. The method of claim 10, wherein the adhesive is filled into a gap formed between the top metal substrate and the bottom metal substrate by capillary in the adhesive filling operation of step (d).

13. The method of claim 6, wherein the top metal substrate and the bottom metal substrate respectively consist of a conductive metal.

14. The method of claim 6, wherein step (b) of disposing a plurality of semiconductor elements comprises the steps of:
(b1) disposing a soldering material at selected positions on an upper side of the bottom metal substrate;
(b2) disposing multiple semiconductor elements onto said selected positions on the bottom metal substrate; and
(b3) disposing a soldering material at selected positions on a lower side of the top metal substrate; and
wherein in step (c) each of the multiple the semiconductor elements is disposed between the top metal substrate and the bottom metal substrate and in contact with a corresponding soldering material of the top metal substrate and a corresponding soldering material of the bottom metal substrate.

15. The method of claim 14, further comprising, following the step of (c), a step of applying elevated temperature to the stacked top and bottom metal substrates and the multiple semiconductor elements, to make the substrates joined to the semiconductor elements, and wherein in step (d) the adhesive is filled to a gap in the joined top and bottom metal substrates by capillary.

16. The method of claim 6, wherein in step (a), a bottom surface of the top metal substrate is configured with at least a first conductive pad, and an upper surface of the bottom metal substrate is configured with at least a second conductive pad.

17. The method of claim 16, wherein a solder paste is provided to coat on the first conductive pad and the second conductive pad between in step (a) and step (b).

18. The method of claim 16, wherein the adhesive is filled into a gap formed between the top metal substrate and the bottom metal substrate by capillary in the adhesive filling operation of step (d).

19. A method for manufacturing a semiconductor package structure, comprising following steps:
(a) providing a top metal substrate and a bottom metal substrate, wherein the top metal substrate and the bottom metal substrate respectively consist of a conductive metal;
(b1) disposing a soldering material at selected positions on an upper side of the bottom metal substrate;
(b2) disposing multiple semiconductor elements onto said selected positions on the bottom metal substrate; and
(b3) disposing a soldering material at selected positions on a lower side of the top metal substrate;
(c) stacking the top metal substrate and the bottom metal substrate to dispose the multiple semiconductor elements between and in contact with the top metal substrate and the bottom metal substrate;
(c1) after stacking the top metal substrate and the bottom metal substrate, applying elevated temperature to the stacked assembly of substrates and multiple semiconductor elements to make the substrates joined to the semiconductor elements;
(d) performing a step of adhesive filling operation to the joined assembly of substrates and semiconductor elements to form an insulating layer between the top metal substrate and the bottom metal substrate;

(e) after performing the adhesive filling operation, performing a drilling process for the top metal substrate and the bottom metal substrate to form multiple through holes, with each through hole being adjacent to one of the multiple semiconductor elements;

(f) forming a metal conductive layer on an inner surface of each of the multiple through holes, the metal conductive layer being connected to the top metal substrate and the bottom metal substrate; and (g) forming a first separated portion and a second separated portion on the top metal substrate and the bottom metal substrate respectively, the first separated portion and the second separated portion dividing a region of the top metal substrate and a region of the bottom metal substrate corresponding to a semiconductor element into two top blocks and two bottom blocks respectively, wherein each of the top and bottom blocks is configured with at least one of the multiple through holes;

wherein the semiconductor package structure comprises multiple semiconductor packages, and wherein each of the multiple semiconductor packages comprises two top blocks and two bottom blocks, one first metal conductive layer on one side of the semiconductor package, and one second metal conductive layer on an opposite side of the semiconductor package, such that the first of the two metal conductive layer connects a first of the two top blocks with a second of the two bottom blocks, and the second metal conductive layer connects the first of the two bottom blocks with the second of the two top blocks.

20. The method of claim 19, further comprising, following the step of (g), a step of coating a first solder mask on the first separated portion and coating a second solder mask on the second separated portion.

21. The method of claim 20, further comprising, following the step of coating, a step (h) of performing a singulation process to form multiple semiconductor packages.

22. The method of claim 19, further comprising, following the step of (g), a step (h) of performing a singulation process to form the multiple semiconductor packages.

23. The method of claim 22, wherein in step (a), a bottom surface of the top metal substrate is configured with at least a first conductive pad, and an upper surface of the bottom metal substrate is configured with at least a second conductive pad.

24. The method of claim 19, wherein in step (a), a bottom surface of the top metal substrate is configured with at least a first conductive pad, and an upper surface of the bottom metal substrate is configured with at least a second conductive pad.

* * * * *